United States Patent [19]
Grosshart et al.

[11] Patent Number: 5,737,175
[45] Date of Patent: Apr. 7, 1998

[54] BIAS-TRACKING D.C. POWER CIRCUIT FOR AN ELECTROSTATIC CHUCK

[75] Inventors: Paul F. Grosshart, Billerica, Mass.; Ralph C. Kerns, San Carlos, Calif.; Peter P. Laquidara, Andover, Mass.

[73] Assignee: Lam Research Corporation, Freemont, Calif.

[21] Appl. No.: 667,031

[22] Filed: Jun. 19, 1996

[51] Int. Cl.[6] .................................................. H02N 13/00
[52] U.S. Cl. ............................................................ 361/234
[58] Field of Search .............................. 361/230, 233, 361/234, 235; 269/8; 279/128

[56] References Cited

U.S. PATENT DOCUMENTS

| | | |
|---|---|---|
| 4,480,284 | 10/1984 | Tojo et al. . |
| 5,103,367 | 4/1992 | Horwitz et al. . |
| 5,110,438 | 5/1992 | Ohmi et al. .............................. 156/345 |
| 5,117,121 | 5/1992 | Watanabe et al. . |
| 5,315,473 | 5/1994 | Collins et al. . |
| 5,325,261 | 6/1994 | Horwitz .................................. 361/234 |
| 5,350,479 | 9/1994 | Collins et al. . |
| 5,444,597 | 8/1995 | Blake et al. ............................. 361/234 |
| 5,463,525 | 10/1995 | Barnes et al. ........................... 361/234 |
| 5,557,215 | 9/1996 | Saeki et al. ............................. 324/765 |
| 5,592,358 | 1/1997 | Shamouilian et al. ................... 361/234 |

FOREIGN PATENT DOCUMENTS 439 000 A1  7/1991  European Pat. Off. .

*Primary Examiner*—Fritz Fleming
*Attorney, Agent, or Firm*—Pennie & Edmonds LLP

[57] ABSTRACT

A DC power circuit for a electrostatic chuck adapted for use in a plasma etching system is disclosed. The power circuit receives an input that reflects a voltage bias on the workpiece caused by the application of an RF signal for creating the plasma. A DC power supply outputs a differential voltage that is balanced by inputting the voltage bias to a common reference node. The balanced DC output voltages are then presented to two electrodes of the ESC to create a clamping force securing the workpiece to the chuck at a lower voltage than would otherwise be applied in the absence of the bias feedback.

13 Claims, 1 Drawing Sheet

BIAS-TRACKING D.C. POWER CIRCUIT FOR AN ELECTROSTATIC CHUCK

BACKGROUND

The present invention relates to a power supply for an electrostatic chuck (ESC). In particular, it relates to a power supply that provides a differential DC voltage output balanced about a floating reference potential that tracks the bias voltage of a workpiece (typically a semiconductor wafer) held by the ESC.

It is necessary to firmly hold a semiconductor wafer in place during integrated circuit fabrication. One well-known class of devices used to secure such wafers in position are electrostatic chucks (ESCs). In an ESC, a voltage difference is applied to two electrodes abutting and separated by a dielectric material. This applied voltage causes charges of a first type within the dielectric to be attracted to one electrode and charges of the opposite type to be attracted to the other electrode. This creates a voltage gradient within the dielectric material. Surface charges on a semiconductor wafer abutting the dielectric are affected by this gradient, causing the wafer to be clamped to the ESC due to the attractive Coulombic forces between the differently charged surfaces.

In a unipolar ESC, a voltage is applied across a dielectric material separating a metallic electrode from the wafer. In such case the wafer acts as the second electrode which, along with the dielectric and the metallic electrode, forms a parallel plate capacitor. The attractive force created by the difference in potential of the charges on the two electrodes clamps the wafer to the ESC.

U.S. Pat. No. 4,480,284 to Tojo et al. shows a unipolar ESC. The ESC structure in this patent has three layers. The first of these is a flat metal electrode, preferably formed from aluminum, copper, titanium, or some other conductive material. Covering the electrode is a dielectric second layer, preferably formed from alumina, titanium dioxide, or barium titanate, any of which serve as an insulator. The surface of the dielectric not abutting the electrode is then impregnated with a third, plastic layer made from epoxy resin or some other synthetic material to fill the pores in the porous dielectric and form a smooth surface, thus improving both the clamping and heat transfer properties of the chuck. The semiconductor wafer to be clamped is then placed on this three-layer assembly. Clamping is realized by connecting one lead from a DC power supply to the metal electrode and the other lead directly to the wafer, creating a voltage gradient across the dielectric. Surface charges on the wafer are attracted to the oppositely charged surface of the resin-impregnated dielectric on which it rests, thus clamping the wafer to the ESC.

In bipolar ESCs, the wafer does not serve as an electrode. Instead, a voltage difference is applied across two other electrodes spaced apart from each other and separated from the wafer by one or more layers of dielectric insulators and/or semiconducting materials. The voltage difference induces image charges on the back side of the wafer (i.e., the side abutting the ESC), thus attracting the wafer to the ESC. In this operation, the wafer typically reaches an electric potential midway between that applied to the two electrodes. U.S. Pat. No. 5,117,121 to Watanabe et al. illustrates such a bipolar ESC.

Both unipolar and bipolar ESCs can be used in plasma chambers for etching the wafer. The plasma is created by applying a high voltage radio-frequency (RF) signal to the electrostatic chuck. A consequence of this action is that a bias voltage, typically on the order of several hundred volts, develops on the wafer. Invariably, this bias voltage increases the necessary voltage that must be applied to the ESC to create the required clamping force.

To satisfactorily clamp a wafer in a unipolar ESC, one must apply to the metal electrode, a voltage nearly as large in magnitude as the plasma-induced bias voltage. Similarly, in a bipolar ESC having a plasma-induced bias voltage of several hundred volts, an even greater voltage must be applied to at least one of the electrodes to satisfactorily clamp the wafer. However, as is known to those skilled in the art, applying arbitrarily large voltages has other deleterious consequences. Applying too great a voltage may exceed the voltage breakdown threshold of the dielectric layers within the ESC, short-circuiting the dielectric and causing the ESC to lose all ability to clamp the workpiece. Although one can theoretically increase the thickness of the dielectric layers to enable them to withstand larger voltages, as a practical matter this is not feasible due to other constraints.

Prior art power supply designs for ESCs have attempted to resolve the seemingly conflicting aims of applying a low enough voltage so as not to breakdown the dielectric layers while applying a high enough voltage to effect wafer clamping. U.S. Pat. No. 5,350,479 to Collins et al. shows a power circuit used to both excite a plasma with an RF signal and apply a DC voltage to the pedestal (or base) of a unipolar ESC to clamp the wafer. In the disclosed design, an RF signal generator couples a bias signal to the ESC's pedestal via one matching network and inductively couples a source signal to the plasma chamber via a second matching network. This arrangement ensures that the potential at the wafer surface induced by the plasma in the chamber is counteracted by the RF biasing signal.

Another approach to reducing the effects of a voltage potential on a wafer is shown in U.S. Pat. No. 5,103,367 to Horwitz et al. This invention focuses on a three electrode bipolar chuck. The first and second electrodes are situated in a common plane and are covered by a thin, insulating substrate supporting layer. The first and second electrodes are excited by alternating current (AC) potentials to create an attractive force between a semiconductor wafer and the ESC which clamps the wafer to the ESC. In one embodiment, the third electrode serves as a common ground for the first two electrodes. In another, it serves as a floating reference used to balance the AC voltage applied to the other two. In the latter embodiment, the third electrode serves as a floating RF reference, gauging the bias voltage caused by the plasma. The amplitudes of the applied AC signals are referenced to this bias voltage, and thus the voltage required to clamp the wafer to the ESC is minimized. In this patent, a sinusoidal AC signal source drives either a single transformer having a center tap connected to the reference (third) electrode or drives a pair of uncoupled transformers, each connected to the reference electrode. In either case, the reference electrode gauges the bias voltage caused by the plasma.

Non-sinusoidal alternating current power supplies may also be used to clamp a wafer to an ESC. Such an approach is taken in U.S. Pat. No. 5,315,473 to Collins et al. Collins describes a differentially driven, balanced AC square-wave voltage having a frequency of about 0.1 to about 60 Hz to clamp a wafer to an ESC. Because the electrodes are differentially driven, the system is balanced with respect to ground, permitting quick clamping and declamping of a workpiece.

None of the prior art teaches how one might use a DC power supply with a reference electrode to apply a balanced DC voltage to a pair of electrodes to create a clamping force in the presence of a high bias voltage.

SUMMARY OF THE INVENTION

The present invention is a DC power circuit for a bipolar electrostatic chuck that accommodates a bias voltage associated with a wafer or other workpiece found in a plasma chamber. Specifically, the circuit provides the electrodes of a bipolar ESC with DC voltages balanced about a measured bias voltage. This feature allows one to apply the lowest possible DC voltage across the semiconducting and/or dielectric layer(s) within the bipolar ESC while maintaining an adequate clamping force.

The invention is realized by a power circuit for an Electrostatic Chuck (ESC) having:

a power source supplying a DC voltage;

a first electrical circuit connected to the power source, said first electrical circuit including a common reference node having a bias-tracking reference voltage, a first and a second output node connected to a first and a second electrode in said electrostatic chuck, and a voltage divider for dividing said DC voltage and supplying said first and second output nodes with a differential DC voltage;

a second electrical circuit connecting a bias voltage output from said electrostatic chuck to said common reference node, thereby providing said common reference node with said bias-tracking reference voltage.

DETAILED DESCRIPTION OF THE INVENTION

Figure 1:
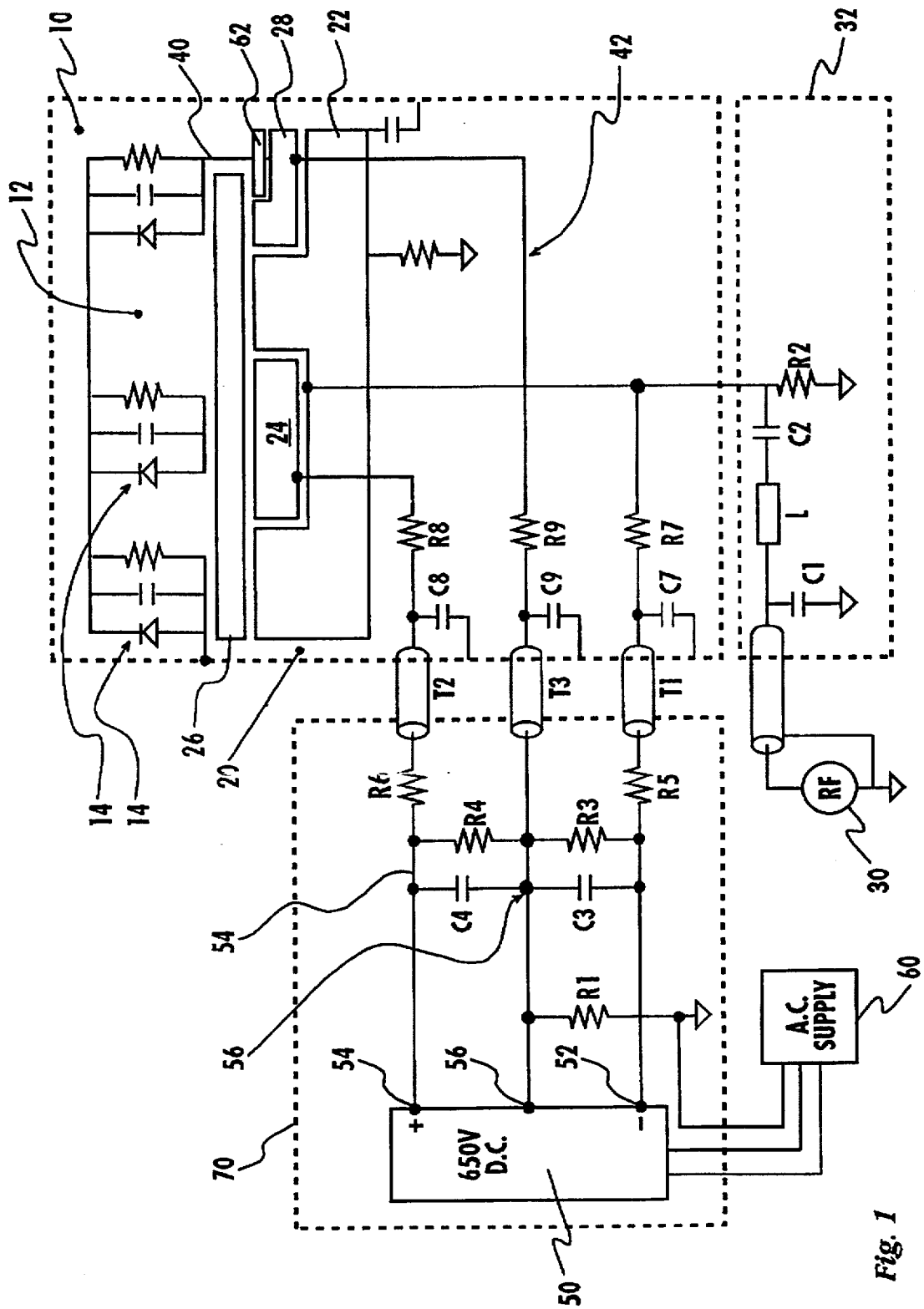
FIG. 1 is a cross-sectional view of an ESC connected to a power circuit in accordance with the invention.

With reference to FIG. 1, a bipolar ESC 20 is adapted for use in a plasma chamber, shown generally as 10. The ESC 20 has a substantially annular first electrode 22 surrounding a second electrode 24. A differential voltage applied to the first and second electrodes 22, 24 creates a clamping force to retain the workpiece 26 (i.e., semiconductor wafer) against the ESC 20.

The plasma 12 is used in the etching of the wafer 26. As is known to those skilled in the art, the plasma, electrically modelled as 14, couples to the workpiece 26, creating a voltage bias on the wafer. The plasma itself is created by an RF signal source 30 coupled to the ESC's first electrode 22 via an automatic matching network 32.

The voltage bias on the wafer is sensed by a reference electrode 40 which, in the preferred embodiment, is a silicon carbide pin. The reference electrode 40 is embedded in a guard ring 28. The guard ring 28, however, is not in contact with wafer 26 or the plasma 12. As insulator member 62 shields the guard ring from the plasma. If the aluminum surface of the guard ring were to contact the plasma 12, sputtering would result, contaminating the wafer 26.

As shown in FIG. 1, the automatic matching network comprises capacitors C1 and C2, resistor R2 and an inductive element L. Both the automatic matching network 32 and the plasma chamber 10 are RF shielded from the environment to prevent interference and cross-talk. The shielding for the automatic matching network 32 is by enclosure. The RF signal is transmitted via a coaxial cable to the first electrode 22 and the RF section of the electrode is within a sealed assembly.

When the RF signal source 30 is activated, the plasma 12 causes the aforementioned bias voltage to appear on the wafer 26. The reference electrode 40 tracks changes in the bias voltage of the wafer 26 caused by fluctuations in the plasma 12.

The preferred embodiment of the power circuit for providing the first and second electrodes 22, 24 with power to clamp the wafer 26 is now described. An alternating current source 60 supplies power to drive a differential DC power source 50. The differential DC power source produces a bipolar applied voltage (+/−325 V) relative to a reference voltage. The differential DC power source has first and second voltage outputs 52, 54 and a reference input 56. As is known to those skilled in the art, the voltage at the outputs 52, 54 is evenly balanced about the reference voltage presented at the reference input 56. That is, during operation, the voltage difference between the first voltage output 52 and the reference input 56 is the same as that between the reference input 56 and the second voltage output 54.

A grounding resistor R1 is interposed between the reference input 56 and ground. This allows a reference voltage at the reference input to float, as dictated by the voltage bias sensed at the reference electrode 40.

The output voltage signal from the differential DC power source is filtered before being applied to the electrodes 22, 24 of the ESC 20. In the preferred embodiment, filtering is accomplished by analog electrical circuitry which provides a desired frequency response. Resistors R3, R4 and capacitors C3, C4 perform the filtering. They also ensure a balanced input, since the input impedance of the chuck is very high. In the preferred embodiment, capacitors C3, C4 are 1 nf, 3 kV capacitors and their respective parallel resistors R3, R4 are 1 MΩ, 1/4 W power resistors.

Current flows from the voltage outputs 52, 54 through current limiting resistors R5, R6 which, in the preferred embodiment are 100 KΩ, 1/4 W resistors and protect against an input overload to the ESC.

The differential DC power source 50, the filter components and the current limiting resistors are all isolated from the electrode assembly in a separate unit indicated generally by reference numeral 70. More particularly, they are RF shielded so as not to be affected by the signals applied to create the plasma 12.

The balanced differential voltage is applied to the first and second electrodes 22, 24 of the ESC through coaxial cables T1, T2. These cables must be able to carry ~2 KVDC. The coaxial cables are interposed between the shielded power source and the first and second electrodes 22, 24. Grounding capacitor C7 and current limiting resistor R7 comprise the electrical circuitry between coaxial cable T1 and the first electrode 22. Similarly, grounding capacitor C8 and current limiting resistor R8 comprise the electrical circuitry between coaxial cable T2 and the second electrode 24. In the preferred embodiment, C7 and C8 are 1 nf, 5 KV capacitors and R7 and R8 are 5 MΩ, 1 W resistors.

The reference input 56 is provided with a bias-tracking reference potential from the reference electrode 40 via electrical circuitry shown generally as 42. As shown in FIG. 1, this electrical circuitry includes a current limiting resistor R9 and a grounding capacitor C9. The bias-tracking reference voltage passes via coaxial cable T3 and is presented to the reference input 56 to complete the feedback loop.

During operation, the differential DC power source outputs a voltage balanced about the bias-tracking reference voltage. This ensures that the first and second electrodes 22, 24 of the ESC are presented with the lowest possible absolute voltage which still achieves an adequate clamping force.

While there has been described what is at present considered to be a preferred embodiment of this invention, it will be clear to those skilled in the art that various changes and modifications may be made without departing from the invention which is intended to cover all such changes and modifications as fall within the true spirit and scope of the claims set forth hereunder.

What is claimed is:

1. A power circuit for a guard ring electrostatic chuck, said guard ring electrostatic chuck having first and second chuck electrodes for clamping a workpiece to said chuck, an RF signal source electrically connected to said chuck for selectively energizing a plasma associated with said chuck, said power circuit comprising:

a differential voltage DC power source having a reference input, a first voltage output and a second voltage output, a voltage difference between said first voltage output and said second voltage output being evenly balanced about a reference potential at said reference input, said DC power source being electrically shielded from said RF signal source;

a sensor electrode for measuring a bias voltage of said plasma, said sensor electrode embedded in the guard ring of said electrostatic chuck;

a first electrical connection between said first voltage output and said first electrode;

a second electrical connection between said second voltage output and said second electrode, said first and second electrical connections providing a differential voltage to respective said first and second electrodes to clamp said workpiece to said chuck; and a third electrical connection between said sensor electrode and said reference input such that said reference potential tracks said bias voltage of said plasma.

2. A power circuit for an electrostatic chuck, said electrostatic chuck having first and second chuck electrodes for clamping a workpiece to said chuck, an RF signal source electrically connected to said chuck for selectively energizing a plasma associated with said chuck, said power circuit comprising:

a differential voltage DC power source having a reference input, a first voltage output and a second voltage output, a voltage difference between said first voltage output and said second voltage output being evenly balanced about a reference potential at said reference input, said DC power source being electrically shielded from said RF signal source;

a sensor electrode for measuring a bias voltage of said plasma;

a first electrical connection between said first voltage output and said first electrode;

a second electrical connection between said second voltage output and said second electrode, said first and second electrical connections providing a differential voltage to respective said first and second electrodes to clamp said workpiece to said chuck; and a third electrical connection between said sensor electrode and said reference input such that said reference potential tracks said bias voltage of said plasma; and a first filter between said first voltage output and said first electrode and a second filter between said second voltage output and said second electrode, said first and second filters each comprising a capacitor and a resistor arranged in parallel between respective said first and second voltage outputs and said reference input.

3. The power circuit of claim 2 wherein said first electrical connection further comprises:

a first current limiting resistor positioned between said first filter and said first electrode, and a second current limiting resistor positioned between said second filter and said second electrode.

4. The power circuit of claim 3 wherein said DC power source, said first and second filters and said first and second current limiting resistors are RF shielded from said electrostatic chuck.

5. The power circuit of claim 1 wherein said RF signal source is electrically connected to one of said first and second electrodes to excite said plasma.

6. The power circuit of claim 1 further comprising a grounding resistor between said reference input and ground, said grounding resistor allowing said reference potential at said reference input to track said bias voltage.

7. In a guard ring electrostatic chuck having a first and a second electrode across which a voltage may be applied to clamp a workpiece, wherein said guard ring electrostatic chuck is connected to a power source supplying a DC voltage, the improvement comprising:

a differential DC voltage source having a reference input and a first and a second voltage output, said first and second voltage outputs being electrically connected to respective said first and second electrodes; and a sensor electrode for measuring a bias voltage of said workpiece, said sensor electrode being embedded in the guard ring of said electrostatic chuck and electrically connected to said reference input.

8. The improvement of claim 7 wherein a grounding resistor is electrically connected between said reference input and ground, said grounding resistor allowing a reference potential at said reference input to track said bias voltage.

9. In an electrostatic chuck having first and a second electrode across which a voltage may be applied to clamp a workpiece, wherein said electrostatic chuck is connected to a power source supplying a DC voltage, the improvement comprising:

a differential DC voltage source having a reference input and a first and a second voltage output, said first and second voltage outputs being electrically connected to respective said first and second electrodes; and a sensor electrode for measuring a bias voltage of said workpiece, said sensor electrode being electrically connected to said reference input; and a first filter is electrically connected between said first voltage output and said first electrode and a second filter is electrically connected between said second voltage output and said second electrode, said first and second filters each comprising a capacitor and a resistor arranged in parallel between respective said first and second voltage outputs and said reference input.

10. A method of retaining a workpiece on a guard ring electrostatic chuck, said workpiece positioned on a first and a second electrode of said guard ring electrostatic chuck, said method comprising the steps of:

providing a differential DC power source having a reference input, a first voltage output and a second voltage output, a voltage difference between said first voltage output and said second voltage output being evenly balanced about a reference potential at said reference input;

providing a sensor electrode for measuring a bias voltage of said workpiece, said sensor electrode being embedded in said guard ring of said electrostatic chuck;

feeding back said bias voltage to said reference input; and connecting said first voltage output to said first electrode and said second voltage output to said second electrode to generate a clamping force for retaining the workpiece.

11. The method of claim 10, further comprising the step of filtering said first and second voltage outputs before connecting said voltage outputs to said electrodes.

12. The method of claim 11, further comprising the step of interposing a grounding resistor between said reference input and ground such that said reference input tracks said bias voltage.

13. The method of claim 10 further comprising the step of RF shielding said differential DC power source.

* * * * *